United States Patent
Kuo

(10) Patent No.: US 7,846,837 B2
(45) Date of Patent: Dec. 7, 2010

(54) THROUGH SUBSTRATE VIA PROCESS

(75) Inventor: Chien-Li Kuo, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 12/248,618

(22) Filed: Oct. 9, 2008

(65) Prior Publication Data

US 2010/0093169 A1    Apr. 15, 2010

(51) Int. Cl.
*H01L 21/44* (2006.01)
(52) U.S. Cl. ...................................... 438/667
(58) Field of Classification Search ............... 438/627, 438/639, 667
See application file for complete search history.

(56) References Cited

U.S. PATENT DOCUMENTS

2006/0177999 A1*  8/2006  Hembree et al. ............ 438/597
2008/0280435 A1* 11/2008  Klootwijk et al. .......... 438/667
2009/0283871 A1* 11/2009  Chang et al. ................ 257/621

OTHER PUBLICATIONS

Jackson et al. ("Processing an integration of copper interconnects" Solid State Technology Mar. 1998).*
Jean-Christophe Eloy, "3D IC & TSV Packaging: Market drivers, Cost, Technologies & Forecasts," ITRI—3D Workshop, Mar. 2008, Taipei.

* cited by examiner

*Primary Examiner*—N Drew Richards
*Assistant Examiner*—Grant S Withers
(74) *Attorney, Agent, or Firm*—J.C. Patents

(57) ABSTRACT

A through substrate via (TSV) process is provided. A substrate having a first side and a second side opposite the first side is provided. A plurality of holes is formed in the substrate at the first side. A first dielectric layer is formed on a sidewall and a bottom of the holes. A second dielectric layer is formed in the holes, wherein a material of the second dielectric layer is different from that of the first dielectric layer. A semiconductor device and an interconnect are formed on the substrate at the first side. At least a portion of the substrate at the second side is removed to expose the second dielectric layer in the holes. The second dielectric layer is removed. A conductive layer is formed in the holes.

11 Claims, 4 Drawing Sheets

THROUGH SUBSTRATE VIA PROCESS

BACKGROUND OF THE INVENTION

1. Field of the Invention

The present invention generally relates to a semiconductor process, and in particular, to a through substrate via (TSV) process.

2. Description of Related Art

Along with the rapid development in techniques of the semiconductor process, further improvement in integration and performance of the semiconductor device is demanded, which advances the development in the structure of stacking wafers. The TSV process is one of the common techniques for fabricating the stacked wafer structure. During the TSV process, holes with high aspect ratio are first formed in the substrate of the wafer, and are then filled with a conductive material. Subsequently, a chemical mechanical polishing (CMP) process is performed, so as to remove the conductive material disposed outside the holes. Afterwards, a portion of the substrate at the backside is removed, so as to thin the substrate and expose the conductive material disposed in the holes. Thereafter, a plurality of wafers is bonded together in a stacked manner, and the wafers electrically connect with one another via the conductive material deployed in the holes.

In general, the TSV can be classified into 4 types, however each type of the TSV process exists its respective defects.

The first type of the TSV process is performed before the fabrication of the semiconductor device, e.g. metal oxide semiconductor (MOS) transistor. When the conductive material filling the holes is metal, contamination usually occurs on the wafer which makes a great impact on the subsequent process, and the metal filling the holes cannot endure the high temperature during the fabrication of the semiconductor device to be formed, e.g. the high temperature of conducting a thermal oxidation process for forming a gate dielectric layer, and the high temperature of conducting a source/drain region activation process. In addition, if the holes are filled with polysilicon to prevent the contamination problem mentioned above, the performance of the device is affected due to high resistance of polysilicon.

The second type of the TSV process is performed after the fabrication of the semiconductor device, e.g. MOS transistor, and before the back-end-of-line (BEOL) process, e.g. interconnect process. Nevertheless, after the holes are filled with the conductive material, difficulty in the CMP process is raised because the semiconductor device has been formed on the substrate.

The third type of the TSV process is performed after the BEOL process and before the bonding of the wafers. However, the area of the wafer usually have to be increased, so as to keep sufficient space for the TSV process after the interconnect process. Besides, complexity of the interconnect process is often raised owing to reservation of the space for TSV process.

The forth type of the TSV process is performed after the bonding of the wafers. However, the bonding material utilized for bonding the wafers is usually damaged due to the incapability to bear the high temperature during the TSV process, so that the wafers cannot be bonded together.

SUMMARY OF THE INVENTION

Accordingly, the present invention is directed to a TSV process, such that the conductive material disposed in the holes can be prevented from damage under high temperature, and the substrate is free of contamination.

A TSV process is described. A substrate is provided, which has a first side and a second side opposite to each other. A plurality of holes is formed in the substrate at the first side. A first dielectric layer is formed on a sidewall and a bottom of the holes. A second dielectric layer is formed in the holes, wherein a material of the second dielectric layer is different from that of the first dielectric layer. A semiconductor device and an interconnect are formed on the substrate at the first side. At least a portion of the substrate at the second side is removed to expose the second dielectric layer in the holes. The second dielectric layer is removed. A conductive layer is formed in the holes.

According to an embodiment of the present invention, the first dielectric layer comprises silicon oxide or silicon nitride.

According to an embodiment of the present invention, the second dielectric layer comprises silicon oxide or silicon nitride.

According to an embodiment of the present invention, a method for forming the first dielectric layer comprises chemical vapor deposition (CVD).

According to an embodiment of the present invention, the conductive layer comprises copper.

According to an embodiment of the present invention, a method for removing a portion of the substrate at the second side comprises chemical mechanical polishing (CMP).

According to an embodiment of the present invention, a method for removing the second dielectric layer comprises wet etching.

According to an embodiment of the present invention, a method for forming the second dielectric layer comprises CVD.

According to an embodiment of the present invention, a method for forming the conductive layer comprises forming a conductive material layer on the substrate at the second side, wherein the conductive material layer fills the holes, and then removing the conductive material layer outside the holes.

According to an embodiment of the present invention, the semiconductor device comprises a metal oxide semiconductor (MOS) transistor.

According to an embodiment of the present invention, wherein the substrate comprises silicon.

As mentioned above, the TSV process of the present invention is carried out by filling the holes with the dielectric layer instead of the conductive layer, and then performing the semiconductor process on the substrate, which is followed by removing the dielectric layer from the holes and filling the holes with the conductive layer. Accordingly, the contamination formed on the substrate can be avoided, and the conductive layer can be prevented from damage caused by the high temperature during the semiconductor process.

In order to make the aforementioned and other features and advantages of the present invention more comprehensible, preferred embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
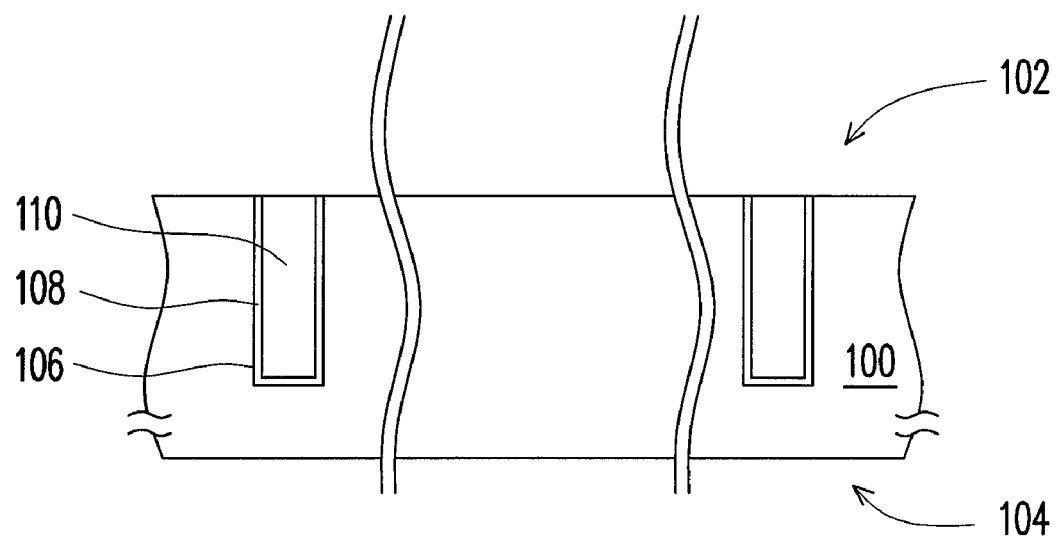
FIGS. 1A-1D depict, in a cross-sectional view, a TSV process according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A-1D depict, in a cross-sectional view, a TSV process according to an embodiment of the present invention. Referring to FIG. 1A, a substrate 100 is provided, which may be a silicon substrate. The substrate 100 has a first side 102 and a second side 104 opposite to each other. Holes 106 are then formed in the substrate 100 at the first side 102. The method for forming the holes 106 is, for example, performing a lithography process and an etching process in sequence. Subsequently, a dielectric layer 108 is formed on the substrate 100. The material of the dielectric layer 108 may be silicon oxide or silicon nitride, and the forming method thereof can utilize CVD to form the film conformally on the substrate 100. Afterwards, a dielectric layer 110 is formed on the substrate 100 and fills the holes 106. The material of the dielectric layer 110 may be silicon oxide or silicon nitride, and the forming method thereof is, for example, CVD. It is noted the material of the dielectric layer 108 must be different from that of the dielectric layer 110, so as to preserve the dielectric layer 108 during the subsequent removal of the dielectric layer 110 based on the varied etching selectivities of different materials. That is to say, when the dielectric layer 108 is silicon oxide, the dielectric layer 110 is silicon nitride. Contrariwise, when the dielectric layer 108 is silicon nitride, the dielectric layer 110 is silicon oxide. The dielectric layers 108 and 110 outside the holes 106 are then removed, so that the dielectric layer 108 remains on the sidewall and the bottom of the holes 106, and the dielectric layer 110 remains in the holes 106. The dielectric layer 108 disposed on the sidewall and the bottom of the holes 106 can serve as a barrier layer and an insulating layer, such that the conductive layer subsequently formed in the holes 106 cannot electrically connect with the substrate 100.

Figure 1B:
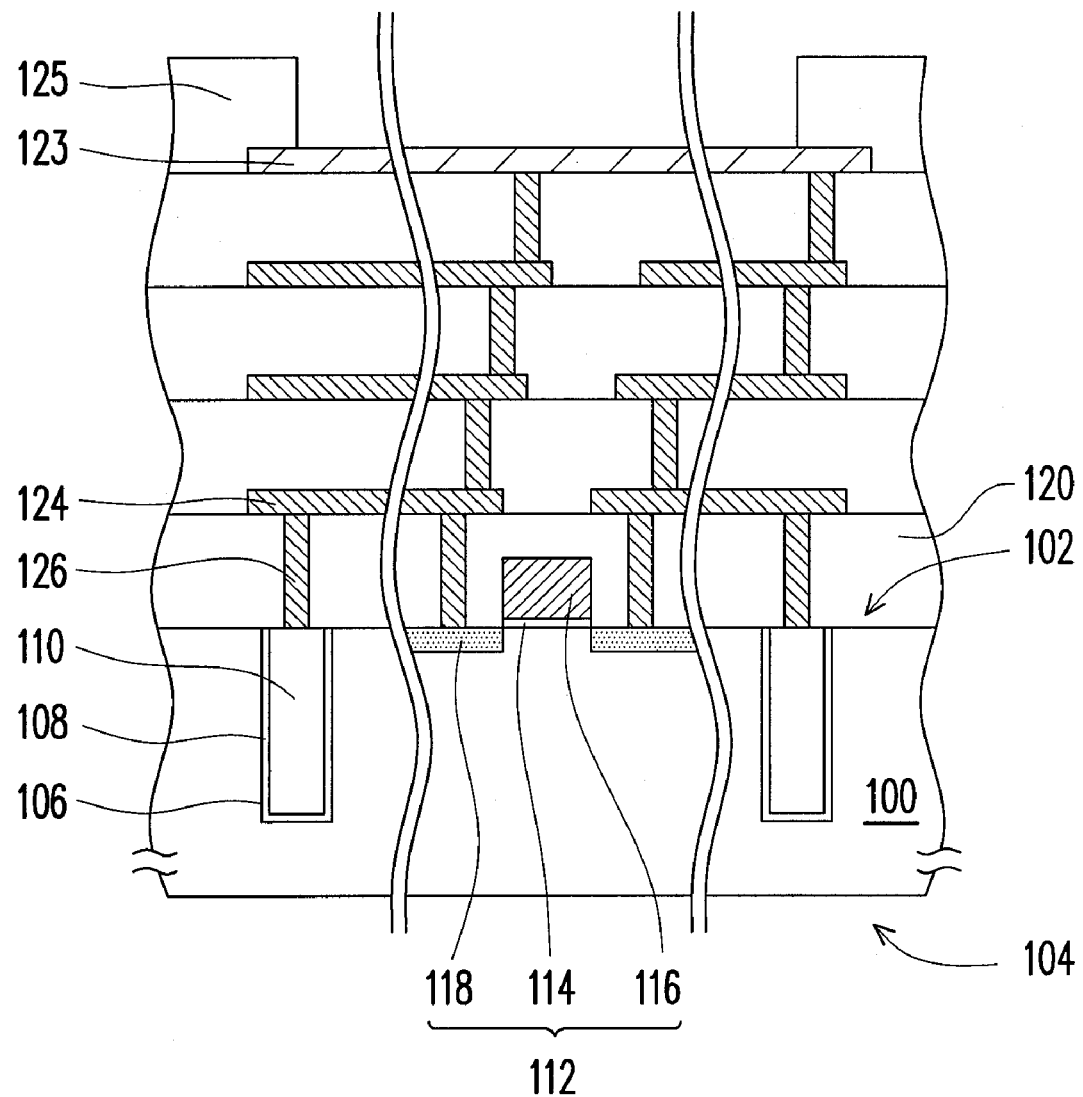

Referring to FIG. 1B, the semiconductor process well-known to all is performed on the substrate 100 at the first side 102. For instant, a semiconductor device 112, a dielectric layer 120, an interconnect, a pad 123 and a passivation layer 125 are formed on the substrate 100 at the first side 102. The semiconductor device 112 may be a MOS transistor. More specifically, the semiconductor device 112 may include a gate dielectric layer 114 and a gate 116 sequentially formed on the substrate 100, and may include source/drain regions 118 deployed in the substrate 100 at both sides of the gate 116. The interconnect includes conductive lines 124 and plugs 126 deployed in different layers, respectively. The materials of the semiconductor device 112, the dielectric layer 120, the interconnect, the pad 123 and the passivation layer 125, and the respective forming methods thereof are known by one of ordinary skill in the art, and thus, all the details thereof are not described herein. It is noted that TSV can connect the semiconductor device 112 by any layer of the conductive lines 124 of the interconnect, preferably by the top layer of the conductive lines 124 of the interconnect. The pad 123 can connect outside by conventional methods.

It is noticed that only the dielectric layers 108 and 110 are deployed in the holes 106 without the conductive material, and thereby contamination which impacts on the subsequent process will not be produced on the substrate 100.

Figure 1C:
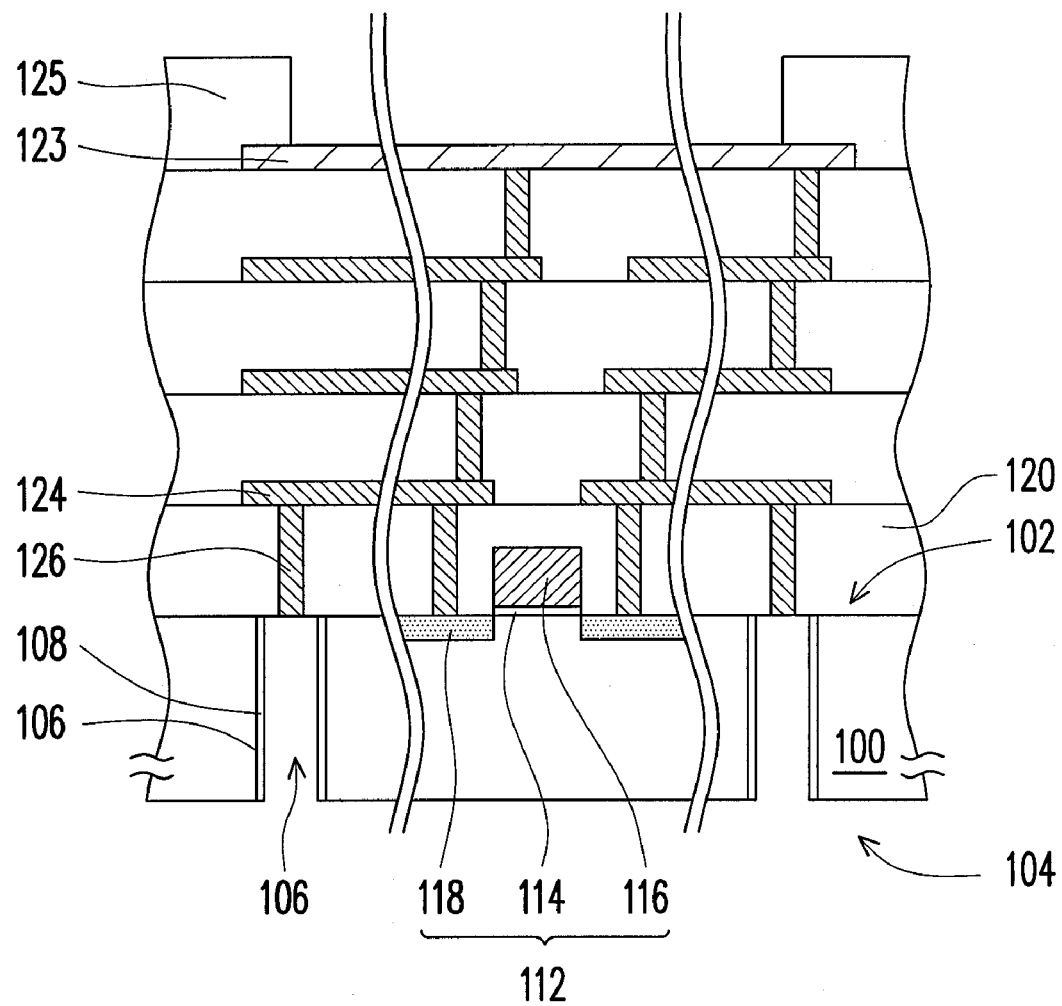

Referring to FIG. 1C, a portion of the substrate 100 at the second side 104 is removed, so as to expose the dielectric layer 110 in the holes 106. The method for removing the partial substrate 100 at the second side 104 is, for example, CMP. In an embodiment, portions of the substrate 100 and the dielectric layer 108 can be removed by utilizing CMP, until the dielectric layer 110 is exposed. In another embodiment, portions of the substrate 100 and dielectric layers 108 and 110 can be removed by utilizing CMP, until the substrate 100 is thinned and the thickness thereof meet the requirement to be formed. Afterwards, the dielectric layer 110 is removed, which may be carried out by utilizing wet etching. Since the material of the dielectric layer 108 is different from that of the dielectric layer 110, the dielectric layer 108 can be left on the sidewall of the holes 106 by adjusting the respective etching rates of dielectric layers 108 and 110.

Figure 1D:
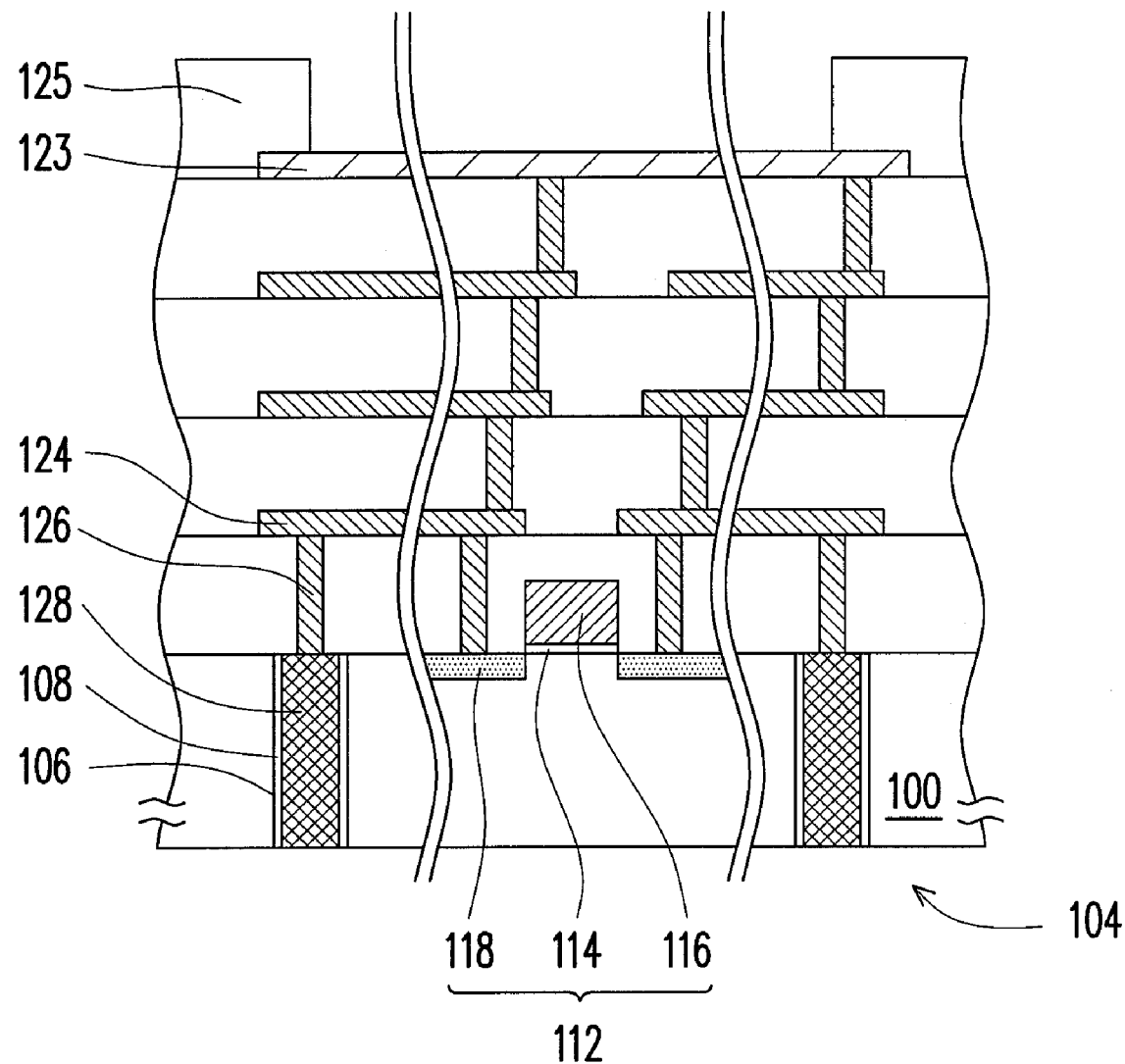

Referring to FIG. 1D, a conductive layer 128 is formed in the holes 106. The material of the conductive layer 128 may be copper. The method for forming the conductive layer 128 is, for example, forming a conductive material layer on the substrate 100 at the second side 104, wherein the conductive material layer fills the holes 106. The conductive material layer disposed outside the holes 106 are then removed, which can be carried out by utilizing CMP. Since the semiconductor device 112 has been formed on the substrate 100 before the conductive layer 128 is formed in the holes 106, the conductive layer 128 can be prevented from damage which is caused by the high temperature for forming the semiconductor device 112.

After conducting the foregoing TSV process, a plurality of wafers can be bonded in a stacked manner by using a bonding material. Since the TSV process has been accomplished before the bonding material bonds the wafers together, the problem arising from the bonding material not being able to bond wafers together due to the high temperature can be solved.

In view of the above, the present invention is carried out by filling the opening with the dielectric layer rather than the conductive layer after the formation of the holes, and subsequently performing the semiconductor process on the substrate. Hence, the contamination formed on the substrate can be avoided.

Moreover, after the semiconductor process is performed, the dielectric layer in the holes is removed, and the conductive layer then fills the holes in the present invention. Thus, the conductive layer can be prevented from damage caused by the high temperature.

Further, the wafer bonding is carried out after the accomplishment of the TSV process in the present invention, and thereby it can be prevented that the wafers which cannot be bonded together due to the high temperature impacting on the bonding material.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A through substrate via (TSV) process, comprising:
providing a substrate, comprising a first side and a second side opposite to the first side;
forming a plurality of holes in the substrate at the first side;
forming a first dielectric layer on a sidewall and a bottom of the holes;

forming a second dielectric layer in the holes, wherein a material of the second dielectric layer is different from a material of the first dielectric layer;

forming a semiconductor device, a plurality of dielectric layers and an interconnect on the substrate at the first side, wherein the dielectric layers in which the interconnect are formed cover the semiconductor device;

removing at least a portion of the substrate at the second side, so as to expose the second dielectric layer in the holes;

removing the second dielectric layer;

forming a conductive layer in the holes, wherein the dielectric layers and the interconnect are formed on the conductive layer and the substrate; and after forming the conductive layer in the holes, bonding the substrate to another substrate in a stacked manner, wherein the step of forming the semiconductor device, the dielectric layers and the interconnect on the substrate at the first side is performed before the step of removing at least the portion of the substrate at the second side, but after the step of forming the second dielectric layer in the holes.

2. The TSV process according to claim 1, wherein the first dielectric layer comprises silicon oxide or silicon nitride.

3. The TSV process according to claim 1, wherein the second dielectric layer comprises silicon oxide or silicon nitride.

4. The TSV process according to claim 1, wherein the step of forming the first dielectric layer comprises performing chemical vapor deposition (CVD).

5. The TSV process according to claim 1, wherein the conductive layer comprises copper.

6. The TSV process according to claim 1, wherein the step of removing a portion of the substrate at the second side comprises performing chemical mechanical polishing (CMP).

7. The TSV process according to claim 1, wherein the step of removing the second dielectric layer comprises performing wet etching.

8. The TSV process according to claim 1, wherein the step of forming the second dielectric layer comprises performing CVD.

9. The TSV process according to claim 1, wherein the step of forming the conductive layer comprises:

forming a conductive material layer on the substrate at the second side, wherein the conductive material layer fills the holes; and removing the conductive material layer outside the holes.

10. The TSV process according to claim 1, wherein the semiconductor device comprises a metal oxide semiconductor (MOS) transistor.

11. The TSV process according to claim 1, wherein the substrate comprises silicon.

\* \* \* \* \*